(12) United States Patent
Kal et al.

(10) Patent No.: US 9,984,890 B2
(45) Date of Patent: May 29, 2018

(54) ISOTROPIC SILICON AND SILICON-GERMANIUM ETCHING WITH TUNABLE SELECTIVITY

(71) Applicant: Tokyo Electron Limited, Minato-ku, Tokyo (JP)

(72) Inventors: Subhadeep Kal, Albany, NY (US); Kandabara N. Tapily, Mechanicville, NY (US); Aelan Mosden, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/448,334

(22) Filed: Mar. 2, 2017

(65) Prior Publication Data

US 2017/0271165 A1    Sep. 21, 2017

Related U.S. Application Data

(60) Provisional application No. 62/302,584, filed on Mar. 2, 2016, provisional application No. 62/302,587, filed on Mar. 2, 2016.

(51) Int. Cl.
*H01L 21/3065* (2006.01)
*H01L 21/322* (2006.01)
(Continued)

(52) U.S. Cl.
CPC .... *H01L 21/3065* (2013.01); *H01J 37/32357* (2013.01); *H01J 37/32724* (2013.01);
(Continued)

(58) Field of Classification Search
None
See application file for complete search history.

(56) References Cited

U.S. PATENT DOCUMENTS

2014/0273493 A1    9/2014 Limdulpaiboon et al.
2014/0308816 A1    10/2014 Wang et al.
(Continued)

FOREIGN PATENT DOCUMENTS

KR    10-2006-0042314 A    5/2006
KR    10-2013-0010396 A    1/2013

OTHER PUBLICATIONS

Korean Intellectual Property Office (KIPO), The International Search Report and the Written Opinion for related International application No. PCT/US2017/020503, dated Jun. 14, 2017, 13 pages.

*Primary Examiner* — Jiong-Ping Lu

(57) ABSTRACT

Isotropic silicon and silicon-germanium etching with tunable selectivity is described. The method includes receiving a substrate having a layer of silicon and a layer of silicon-germanium with sidewall surfaces of silicon and silicon-germanium being uncovered, positioning the substrate in a processing chamber configured for etching substrates, and modifying uncovered surfaces of silicon and silicon-germanium by exposing the uncovered surfaces of silicon and silicon-germanium to radical species. The method further includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct at a second substrate temperature that is higher than the first substrate temperature, and controlling the second substrate temperature to tune the sublimation rate and etch selectivity of a silicon oxide material relative to a silicon-germanium oxide material.

20 Claims, 4 Drawing Sheets

(51) Int. Cl.
  *H01L 21/306* (2006.01)
  *H01J 37/32* (2006.01)
  *H01L 21/311* (2006.01)
  *H01L 21/02* (2006.01)

(52) U.S. Cl.
  CPC .... *H01L 21/0234* (2013.01); *H01L 21/30604* (2013.01); *H01L 21/31116* (2013.01); *H01L 21/322* (2013.01)

(56) References Cited

U.S. PATENT DOCUMENTS

2015/0126039 A1* 5/2015 Korolik ............... H01L 21/3065
                                                            438/718
2015/0126040 A1   5/2015 Korolik et al.
2016/0093506 A1* 3/2016 Chen ................. H01L 21/31116
                                                            438/723

* cited by examiner

ISOTROPIC SILICON AND SILICON-GERMANIUM ETCHING WITH TUNABLE SELECTIVITY

CROSS-REFERENCE TO RELATED APPLICATIONS

This application is related to and claims priority to U.S. provisional application Ser. No. 62/302,584 filed on Mar. 2, 2016, the entire contents of which are herein incorporated by reference. This application is related to and claims priority to U.S. provisional application Ser. No. 62/302,587 filed on Mar. 2, 2016, the entire contents of which are herein incorporated by reference.

FIELD OF THE INVENTION

The present invention generally relates to fabrication of features in a semiconductor device, and more particularly to a method for providing isotropic silicon and silicon-germanium etching with tunable selectivity.

BACKGROUND OF THE INVENTION

Fabrication of semiconductor devices is a multi-step process of forming features on a semiconductor substrate (wafer) or other substrate. Steps can include material growth, patterning, doping, deposition, etching, metallization, planarization, and so forth. Features formed on a substrate can include various transistors. Transistors can be planar or non-planar, and can also have single gates or multiple gates.

Various etching processes benefit by being able to etch one material relative to another material so that one material is removed, while another material largely remains on the substrate. For example, photoresist has its name in part because it resists being etched by dry plasma etch processes. Photoresist materials are conventionally formed into relief patterns which function as etch masks to etch transfer a pattern into one or more underlying materials.

SUMMARY OF THE INVENTION

Methods described herein provide a dry isotropic Si etch with high selectivity to SiGe, Ge and other films that includes a two-step process that can be cyclically repeated to meet various the etch requirements. Such etching methods can provide etch selectivity ratios of at least 4:1, for example 10:1 and greater. According to other embodiments, methods are provided for isotropic non-selective etching of polycrystalline or amorphous Si and SiGe or Ge or other films. Such etching methods can provide etch selectivity ratios of about 1:1 for a given pair of materials.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

This summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to one embodiment, the method includes receiving a substrate having a layer of silicon and a layer of silicon-germanium with sidewall surfaces of silicon and silicon-germanium being uncovered, positioning the substrate in a processing chamber configured for etching substrates, and modifying uncovered surfaces of silicon and silicon-germanium by exposing the uncovered surfaces of silicon and silicon-germanium to radical species. The method further includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct at a second substrate temperature that is higher than the first substrate temperature, and controlling the second substrate temperature such that silicon oxide material sublimates at a) a rate that is at least four times greater than a sublimation rate of silicon-germanium oxide material, or b) a rate that is approximately equal to a sublimation rate of silicon-germanium oxide material. The method can further include cycling between steps of modifying uncovered surfaces of silicon and silicon-germanium, and executing the gaseous chemical oxide removal process.

According to another embodiment, the method includes receiving a substrate having a first material layer and a second material layer, the first material layer selected from the group consisting of silicon, silicon nitride, silicon oxide, and silicon oxynitride, the second material layer selected from the group consisting of silicon-germanium, SiGeAs, GeAs, InGaAs, TiOx, HfO, ZrO, and ZrN, sidewall surfaces of the first material layer and the second material layer uncovered, positioning the substrate in a processing chamber configured for etching substrates, and modifying uncovered surfaces of the first material layer and the second material layer by exposing the uncovered surfaces of the first material layer and the second material layer to radical species. The method further includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct by at a second substrate temperature that is higher than the first substrate temperature, and controlling the second substrate temperature such that sublimation of the first material layer occurs at a) a rate that is at least four times greater than a sublimation rate of the second material layer, or b) a rate that is approximately equal to a sublimation rate of second material layer. The method can further include cycling between steps of modifying uncovered surfaces of the first and second material layers, and executing the gaseous chemical oxide removal process.

DETAILED DESCRIPTION OF SEVERAL EMBODIMENTS

Figure 1A:
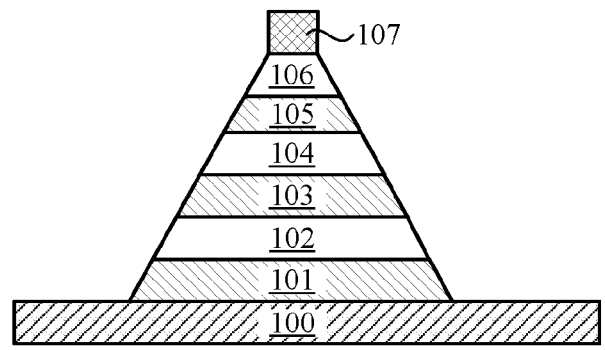
FIGS. 1A-1E show through schematic cross-sectional views a method for processing a substrate according an embodiment of the invention.

Various different materials used in semiconductor fabrication have varying degrees of etch resistivity. It can be desirable to have a high degree of etch selectivity between two or more materials for various fabrication steps. Unfortunately, many materials used conventionally have etch resistivities that are relatively similar, which makes it difficult to etch one material without substantially etching the other. If a given pair of materials, with a given etch chemistry, have an etch rate ratio of only about 2:1, then a given material targeted for removal can be removed, but the remaining material may lose half its height, width, etc., which can lead to device failure, or an etch process that is not acceptable for use in fabrication. In other fabrication schemes it is desirable to have a uniform etch rate between of two chemically different materials. However, a given pair of materials can have etch rate ratios that are not desired.

Amorphous silicon (a-Si), polycrystalline silicon (poly-Si) and single crystal Si, in conjunction with silicon-germanium (SiGe, which is an alloy of silicon and germanium with varying Si:Ge composition, i.e., $Si_xGe_{1-x}$) are widely used in the semiconductor industry for different applications. For sub 10 nm technology nodes, SiGe as source-drain material has shown potential to improve electrical performance for transistors. Complex process flows for the design and fabrication of three dimensional (3D) Si and SiGe based field effect transistors (FETs), often have challenging requirements at various fabrication stages. One challenge is to enable lateral Si etching with relatively high selectivity to SiGe, as well as to enable lateral SiGe etching with relatively high selectivity to Si. Another challenge is to be able to etch relatively high aspect ratios, including aspect ratios greater than 5:1. Another challenge is to have high selectivity to hardmask materials such as silicon nitride (SiN) and silicon dioxide ($SiO_2$), though for some integration schemes some hardmask loss can be acceptable. Yet another challenge is to execute a conformal trim or etch step that etches silicon, silicon-germanium, or germanium at a same rate. Such a design requirement can be based on creating a smooth etch profile.

Fabrication of certain devices, such as semiconductor nanowires and 3D architecture, requires, at times, conformal etching, shrinking, or trimming of a given pair of chemically different materials. Such conformal etching can require lateral etching of two or more layers. With lateral etching needed, vertical anisotropic etching techniques cannot be successfully implemented. Due to the isotropic etch requirement, plasma-based etching faces limitations in terms of directionality and often with selectivity towards various films. Moreover, plasma-based etching also has a tendency to induce damage. Such damage makes a process window limited. Furthermore, such damages at the device level (e.g. FET module) tend to compromise electrical performance of the transistor and even contribute to failure. An alternative to plasma-based etching is wet etching. A common wet etching chemistry includes using a mixture of hydrofluoric acid (HF) and nitric acid ($HNO_3$), which can be used for etching silicon. There are challenges with such wet etching. The hydrophobicity of the wet etch chemistry may prevent fully etching features that have a tight pitch and/or have high aspect ratios. Use of wet etch chemistries may also result in pattern collapse or create etch stop/defects when interacting with dopants (such as boron and phosphorus dopants).

Another option is a gas-based chemical etching. Gas-based chemical etching can be fully isotropic without the incidental damage from isotropic plasma-based etching. One option is chemical oxide removal (COR) process. Chemical oxide removal uses a mixture of fluorine-based gases (e.g. HF, $F_2$) and nitrogen-based gases (e.g. $NH_3$, $NF_3$) in varying ratios. A chemical reaction using these gases can be carried out at pressures around or above 15 mTorr and temperatures greater than 25° C., to form solid ammonium hexafluorosilicate, followed by evaporation at a temperature over 100° C. Silicon oxide or silicon nitride hard mask removal amounts can vary based on time, pressure, or temperature. Such gas-based chemical etching, however, does not conventionally provide desired etch selectivities for advanced material combinations. For example, $NH_3/F_2$ based gas phase etching, when executed with a combination of Si and SiGe materials results in an etch ratio of 1.2:1 for Si:SiGe selectivity. Many device design specifications need an Si:SiGe selectivity that is greater than 10:1.

According to some embodiments, methods for gas-based etching are provided that can provide Si: SiGe selectivity of at least 4:1, for example 10:1 or greater. Accordingly, damage-free lateral etching of devices can be executed.

According to other embodiments, methods for gas-based etching are provided that can etch combinations of Si, SiGe, and Ge at approximately the same etch rate. Accordingly, damage-free lateral etching of devices can be executed while providing a smooth profile.

One example embodiment is a method for processing a substrate. A substrate is received having a layer of Si and a layer of SiGe with sidewall surfaces of Si and SiGe being uncovered. This can include alternating layers of Si and SiGe to be etched laterally. The substrate can include a layer of masking material. The substrate is positioned in a processing chamber configured for etching substrates, such as an etch chamber.

Next, surfaces on the substrate are modified. Uncovered surfaces of Si and SiGe are modified by exposing the uncovered surfaces of Si and SiGe to a radical species. For example, Si and SiGe structures can be treated with radical species of oxygen (O), hydrogen (H), or a combination O and H. During this process, the exposed Si and SiGe surface is chemically and/or physically modified. The composition of the modified surface can include an oxidized form of Si and Ge, or an implanted film of Si and SiGe, or a combination of both. Several other radical species based on noble gases (e.g., argon (Ar), helium (He), etc), halide (e.g., fluorine (F), chlorine (Cl), etc.) can also be used for modification. This surface modification can be based on an aspect ratio of incoming structures and etch requirements to control a rate or depth of the films being modified. Such controls can be achieved by varying the gas pressure, the substrate temperature or chamber temperature, the gas flow and the exposure time of the process.

According an embodiment, thereafter, a gaseous chemical oxide removal process is executed that includes flowing a mixture of a nitrogen-containing gas and a fluorine-containing gas at a first substrate temperature to form a fluorine byproduct on the substrate followed by executing a sublimation process to remove the fluorine byproduct from the substrate by at a second substrate temperature that is higher than the first substrate temperature. According to one embodiment, the method includes controlling the second substrate temperature such that silicon oxide etch byproduct material sublimates at a rate that is at least 4:1 greater than a sublimation rate of silicon-germanium oxide etch byproduct material. According to another embodiment, the method includes controlling the second substrate temperature such that silicon oxide material sublimates at a rate that is approximately equal to a sublimation rate of silicon-germanium oxide material. Thus, the modified surface is isotopically etched using etch techniques that have the ability to tune the selectivity of one modified film over other. Such selectivity can result as a function of chemistry selected, or by tuning of etch recipe parameters.

The steps of surface modification by oxidation and chemical oxide removal can be employed in unison to remove two or more materials at the same rate, thereby making the etch non-selective. This aspect of the technique is particularly advantageous for materials that either are difficult to etch with certain chemistries or that have an inherent high selectivity and the requirement is to reduce the selectivity. Depending on a given set of materials, choice of ions and process conditions can enable etch uniformity. Typically a HF/$NH_3$ based COR etch chemistry etches Si and SiGe at a very low rate. With techniques herein, however, etch chemistries can be tuned to be non-selective between Si and SiGe. This is made possible by surface/film modification via radical oxygen, which can oxidize species of Si and SiGe. These modified films can then be etched by chemical oxide removal with F and N based chemistry.

To achieve such a highly selective isotropic etch, a modification of chemical oxide removal can be used. This gas phase etch is achieved by adsorption of nitrogen-containing gas (e.g., $NH_3$, $NF_3$ etc.) on the surface of Si and Si—Ge which activates the surfaces to react with fluorine-containing and/or hydrogen-containing gas (e.g., HF, $F_2$) to form a fluorinated byproduct. In one example, the nitrogen-containing gas and the fluorine-containing gas may be generated via plasma processing executed remotely from the processing chamber. The composition of the modified film can be used to determine the composition of the fluorinated byproduct. As an example, for Si type modified film the reaction byproduct can be $[(Si)_iO_mF_nH_p]$ whereas for a SiGe type modified film the byproduct can be of the form of $[(Si)_i(Ge)_qO_mF_nH_p]$. The byproduct is then sublimated at a higher temperature at reduced pressure (less than 50 mT). The composition of the byproduct can be used to identify an appropriate sublimation temperature. For example, $GeF_4$ sublimates at 1000° C., germanium oxide sublimates above 550° C. under high vacuum, but $(NH_4)_2SiF_6$ sublimates at 100° C. under reduced pressure. Oxidation temperature ranges herein can be between 25° C. and 90° C. For the sublimation step, sublimation temperatures can be between 100° C. to 225° C. By carefully tuning the sublimation temperature, the $[(Si)_iO_mF_nH_p]$ can be selectively sublimated over relative to $[(Si)_i(Ge)_qO_mF_nH_p]$. Note that exact sublimation temperatures can be dependent on exact composition of a given material (e.g., type, amount of doping, etc.) as well as pressure and ambient gases. This process of selective sublimation regenerates or exposes the underlying film to undergo further oxidation. The unsublimated film offers a layer of protection for subsequent etches and modifications. An additional degree of etch selectivity between the modified films can be achieve by tuning the etch/reaction rate of different materials by modifying (A) adsorption of the etch gases on the surface of materials, and (B) modifying availability or concentration of the etch gases.

During chemical oxide removal, hardmask materials, such as SiO, can be etched also. Depending on a given fabrication process, this is acceptable especially if a given hardmask etches a close to the same rate as the underlying material. Note that some fabrication processes may require a new hardmask to be applied for subsequent processing.

FIGS. 1A-1E show through schematic cross-sectional views a method for processing a substrate according to an embodiment of the invention. The figures illustrate an example progression of an etch process herein. Note that layers of Si can be laterally etched while layers of SiGe remain substantially unetched. As described above, oxidation temperatures can range from about 25° C. to 90° C. In an alternative embodiment, oxidation can be executed in a plasma chamber that uses surface wave microwave energy to create plasma. In such plasma processing chambers, oxidation can be executed from room temperature up to about 450° C. A given system for executing processes herein can include a tool or common platform that has one module configured for chemical oxide removal, and a second module for oxidation that uses surface wave microwave energy for plasma generation. The triangle profile of the structure in the figures is merely exemplary, as any geometric structures can be processed according to the method described herein. Further, the identified films are exemplary. Many other films can be used instead of SiGe such as SiGeAs, GeAs, TiN, TiO, HfO, HfN, ZrO, and ZrN. Likewise, instead of Si, other films can be used, such as SiO, SiN, and SiON.

Figure 1B:
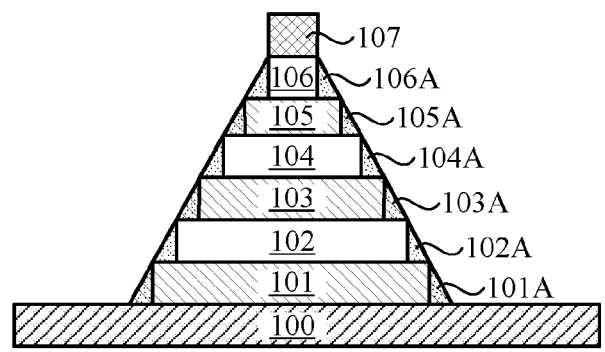

FIG. 1A schematically shows a substrate containing a base layer 100 and a structure of vertically alternating layers 102, 104, and 106 of Si and layers 101, 103, 105 of SiGe with sidewall surfaces of Si and Ge being uncovered. A masking material 107 (e.g., SiN) is also shown. Processing of the substrate includes modifying uncovered surfaces of Si and SiGe by exposing the uncovered surfaces of Si and SiGe to a radical species. According to some embodiments, the modifying can use radical species of oxygen (O), hydrogen (H), or a combination O and H. Other radical species used for modification can be based on noble gases halides, or a combination thereof. FIG. 1B schematically shows modified surfaces 102A, 104A, and 106A of Si, and modified surfaces 101A, 103A, and 105A of SiGe.

The method of exposing the uncovered surfaces of silicon and silicon-germanium to radical species can include controlling a rate and depth of modification of the uncovered surfaces of Si and SiGe by varying a parameter value within the gas phase based etch chamber, the parameter value selected from the group consisting of substrate temperature, chamber pressure, gas flow rate, and exposure time.

Figure 1C:
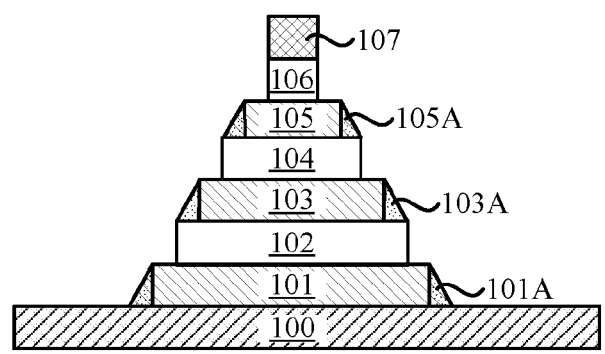

Thereafter, further processing of the substrate includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct by at a second substrate temperature that is higher than the first substrate temperature. The method includes controlling the second substrate temperature such that silicon oxide material sublimates at a rate that is at least four times greater than a sublimation rate of silicon-germanium oxide material. The resulting substrate is schematically shown in FIG. 1C where the layers 102, 104, and 106 of Si have been isotropically and laterally etched by sublimation of the silicon oxide material but the layers 101, 103, 105 of SiGe have not significantly been etched.

Figure 1D:
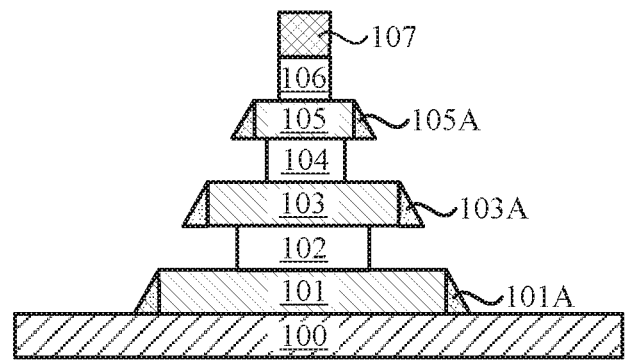
Figure 1E:
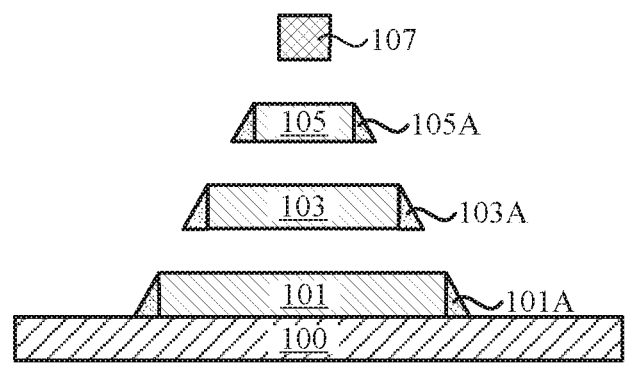

The method can further include cycling between the steps of modifying uncovered surfaces of Si and SiGe, and executing the gaseous chemical oxide removal process. FIG. 1D schematically shows the substrate after the cycling to partially release the layers 101, 103, 105 of SiGe, and FIG. 1E schematically shows the substrate after the cycling to fully release the layers 101, 103, 105 of SiGe. Further processing of the substrate can form nanowires containing the layers 101, 103, 105 of SiGe.

In one process example, a substrate containing a structure of vertically alternating layers of Si and SiGe with uncovered sidewall surfaces of Si and SiGe was processed. The processing included modifying the uncovered surfaces of Si and SiGe by exposure to O and H radical species that were formed by plasma excitation of $H_2$ gas and $O_2$ gas. Thereafter, a chemical oxide removal process was performed using a mixture of $F_2$ and $NH_3$. The cycling between steps of modifying uncovered surfaces of Si and SiGe, and executing the gaseous chemical oxide removal process was carried out at total of four times. A Si: SiGe etch selectivity of about 18:1 for the four cycles was measured using cross-sectional scanning electron microscopy (SEM). This corresponds to Si:SiGe etch selectivity of about 4.5:1 per cycle. For comparison, substrates that were only processed by a chemical oxide removal process showed a Si: SiGe etch selectivity of about 1.2:1.

According to one embodiment, film roughness may be reduced by treating the substrate with O radical species from an $O_2$ plasma source (e.g., a microwave plasma) or a thermal $O_2$ source (e.g., a furnace), and thereafter, performing a chemical oxide removal process.

According to one embodiment, layers of Si and SiGe can be laterally etched at a same rate to shrink a given structure uniformly or trim a given structure uniformly for a smooth profile. To achieve such a highly uniform isotropic etch, a modification of chemical oxide removal can be used. This gas phase etch is achieved by adsorption of N containing gas (e.g., $NH_3$, $NF_3$) on the surface of Si and SiGe which activates the surfaces to react with fluorine-containing and/or hydrogen-containing gas (e.g., HF, $F_2$) to form a fluorinated byproduct. The composition of the modified films can be used to determine the composition of the fluorinated byproduct. By tuning the sublimation temperature, etch byproduct from oxidized silicon can be sublimated at a same sublimation rate as that of oxidized silicon-germanium An additional degree of etch uniformity between the modified films can be achieve by tuning the etch/reaction rate of different materials by modifying adsorption of the etch gasses on the surface of materials, and modifying availability or concentration of the etch gases.

Figure 2A:
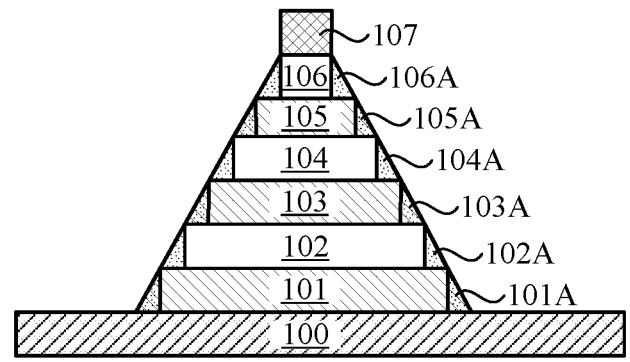
FIGS. 2A and 2B show through schematic cross-sectional views a method for processing a substrate according an embodiment of the invention.
Figure 2B:
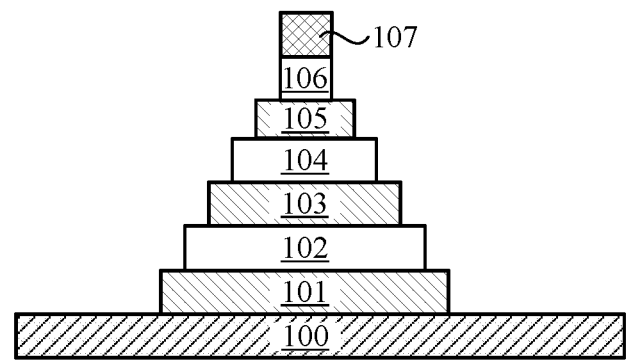

FIGS. 2A and 2B show through schematic cross-sectional views a method for processing a substrate according an embodiment of the invention. FIG. 1B has been reproduced as FIG. 2A and schematically shows modified surfaces 102A, 104A, and 106A of Si, and modified surfaces 101A, 103A, and 105A of SiGe. Thereafter, further processing of the substrate in FIG. 2A includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct by at a second substrate temperature that is higher than the first substrate temperature. The method includes controlling the second substrate temperature such that silicon oxide material sublimates at a rate that is approximately equal to a sublimation rate of silicon-germanium oxide material. The resulting substrate is schematically shown in FIG. 2B where the layers 102, 104, and 106 of Si and the layers 101, 103, 105 of SiGe have been isotropically and laterally etched by sublimation of the silicon oxide material and the silicon-germanium oxide material.

Figure 3A:
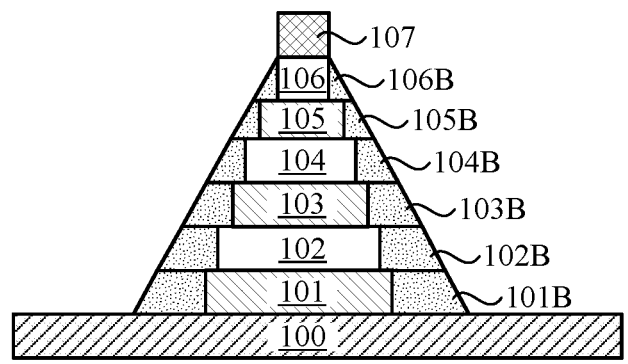
FIGS. 3A and 3B show through schematic cross-sectional views a method for processing a substrate according an embodiment of the invention.
Figure 3B:
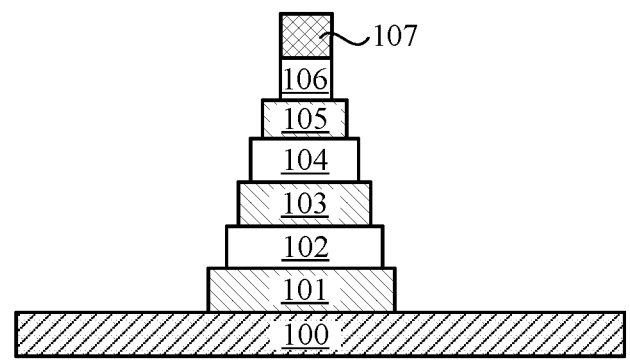

FIGS. 3A and 3B show through schematic cross-sectional views a method for processing a substrate according an embodiment of the invention. FIG. 3A is similar to FIG. 2A but shows greater depth of modification of the uncovered surfaces of Si and SiGe and formation of modified surfaces 102B, 104B, and 106B of Si, and modified surfaces 101B, 103B, and 105B of SiGe. Thereafter, further processing of the substrate in FIG. 3A includes executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct by at a second substrate temperature that is higher than the first substrate temperature. The method includes controlling the second substrate temperature such that silicon oxide material sublimates at a rate that is approximately equal to a sublimation rate of silicon-germanium oxide material. The resulting substrate is schematically shown in FIG. 3B where the layers 102, 104, and 106 of Si and the layers 101, 103, 105 of SiGe have been isotropically and laterally etched by sublimation of the silicon oxide material and the silicon-germanium oxide material.

In one process example, a substrate containing a structure of vertically alternating layers of Si and SiGe with uncovered sidewall surfaces of Si and SiGe was processed. The processing included modifying the uncovered surfaces of Si and SiGe by exposure to O radical species that were formed by plasma excitation of $O_2$ gas. Thereafter, a chemical oxide removal process was performed using a mixture of $F_2$ and $NH_3$. The cycling between steps of modifying uncovered surfaces of Si and SiGe, and executing the gaseous chemical oxide removal process was carried out four times. A Si: SiGe etch selectivity of about 1:1 for the four cycles was measured using cross-sectional SEM.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for processing a substrate, the method comprising:
receiving a substrate having a layer of silicon and a layer of silicon-germanium with sidewall surfaces of silicon and silicon-germanium being uncovered;
positioning the substrate in a processing chamber configured for etching substrates;
modifying uncovered surfaces of silicon and silicon-germanium by exposing the uncovered surfaces of silicon and silicon-germanium to radical species;
executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct at a second substrate temperature that is higher than the first substrate temperature; and
controlling the second substrate temperature such that silicon oxide material sublimates at a) a rate that is at least four times greater than a sublimation rate of silicon-germanium oxide material,
or b) a rate that is approximately equal to a sublimation rate of silicon-germanium oxide material.

2. The method of claim 1, wherein the radical species include oxygen (O), hydrogen (H), a noble gas, a halide, or a combination thereof.

3. The method of claim 1, wherein the substrate further includes a layer of masking material.

4. The method of claim 1, further comprising:
cycling between steps of modifying uncovered surfaces of silicon and silicon-germanium, and executing the gaseous chemical oxide removal process.

5. The method of claim 4, wherein the cycling between steps of modifying uncovered surfaces of silicon and silicon-germanium and executing the gaseous chemical oxide removal process provides a Si: SiGe etch selectivity of greater than 10:1.

6. The method of claim 1, wherein exposing the uncovered surfaces of silicon and silicon-germanium to radical species includes controlling a rate of modification of the uncovered surfaces of silicon and silicon-germanium by varying a parameter value within the gas-phase based processing chamber, the parameter value selected from the group consisting of substrate temperature, chamber pressure, gas flow rate, and exposure time.

7. The method of claim 1, wherein exposing the uncovered surfaces of silicon and silicon-germanium to radical species includes controlling a depth of modification of the uncovered surfaces of silicon and silicon-germanium by varying a parameter value within the gas-phase based processing chamber, the parameter value selected from the group consisting of substrate temperature, chamber pressure, gas flow rate, and exposure time.

8. The method of claim 1, wherein the first substrate temperature is in the range 25° C. and 90° C., and wherein the second substrate temperature is in the range 100° C. to 225° C.

9. The method of claim 1, wherein the substrate has multiple structures of vertically alternating layers of silicon and silicon-germanium with sidewall surfaces of silicon and silicon-germanium being uncovered.

10. The method of claim 1, wherein the nitrogen-containing gas and the fluorine-containing gas are generated via plasma processing executed remotely from the processing chamber.

11. A method for processing a substrate, the method comprising:
receiving a substrate having a first material layer and a second material layer, the first material layer selected from the group consisting of silicon, silicon nitride, silicon oxide, and silicon oxynitride, the second material layer selected from the group consisting of silicon-germanium, SiGeAs, GeAs, InGaAs, TiOx, HfO, ZrO, and ZrN, sidewall surfaces of the first material layer and the second material layer uncovered;
positioning the substrate in a processing chamber configured for etching substrates;
modifying uncovered surfaces of the first material layer and the second material layer by exposing the uncovered surfaces of the first material layer and the second material layer to radical species;
executing a gaseous chemical oxide removal process that includes flowing a mixture of a nitrogen-containing gas and a fluorine-containing gas at a first substrate temperature to form a fluorine byproduct followed by executing a sublimation process to remove the fluorine byproduct by at a second substrate temperature that is higher than the first substrate temperature; and
controlling the second substrate temperature such that sublimation of the first material layer occurs at a) a rate that is at least four times greater than a sublimation rate of the second material layer,
or b) a rate that is approximately equal to a sublimation rate of second material layer.

12. The method of claim 11, wherein the radical species include oxygen (O), hydrogen (H), a noble gas, a halide, or a combination thereof.

13. The method of claim 11, wherein the substrate further includes a layer of masking material.

14. The method of claim 11, further comprising:
cycling between steps of modifying uncovered surfaces of the first and second material layers, and executing the gaseous chemical oxide removal process.

15. The method of claim 14, wherein the cycling between steps of modifying uncovered surfaces of the first and second material layers and executing the gaseous chemical oxide removal process provides a first material layer:second material layer etch selectivity of greater than 10:1.

16. The method of claim 11, wherein exposing the uncovered surfaces of first and second material layers to radical species includes controlling a rate of modification of the uncovered surfaces of the first and second material layers by varying a parameter value within the gas-phase based processing chamber, the parameter value selected from the group consisting of substrate temperature, chamber pressure, gas flow rate, and exposure time.

17. The method of claim 11, wherein exposing the uncovered surfaces of first and second material layers to radical species includes controlling a depth of modification of the uncovered surfaces of the first and second material layers by varying a parameter value within the gas-phase based processing chamber, the parameter value selected from the group consisting of substrate temperature, chamber pressure, gas flow rate, and exposure time.

18. The method of claim 11, wherein the first substrate temperature is between 25° C. and 90° C., and wherein the second substrate temperature is between 100° C. and 225° C.

19. The method of claim 11, wherein the substrate has multiple structures of vertically alternating layers of the first and second materials with sidewall surfaces of the first and second material layers being uncovered.

20. The method of claim 11, wherein the nitrogen-containing gas and the fluorine-containing gas are generated via plasma processing executed remotely from the processing chamber.

* * * * *